United States Patent
Hara

(10) Patent No.: US 7,512,004 B2
(45) Date of Patent: Mar. 31, 2009

(54) SEMICONDUCTOR MEMORY DEVICE HAVING STACKED GATE INCLUDING CHARGE ACCUMULATION LAYER AND CONTROL GATE AND TEST METHOD THEREOF

(75) Inventor: Tokumasa Hara, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 11/765,749

(22) Filed: Jun. 20, 2007

(65) Prior Publication Data

US 2007/0297262 A1    Dec. 27, 2007

(30) Foreign Application Priority Data

Jun. 21, 2006    (JP)    ............... 2006-171856

(51) Int. Cl.
*G11C 16/04*    (2006.01)
*G11C 11/34*    (2006.01)

(52) U.S. Cl. ............... 365/185.14; 365/185.05; 365/185.26; 365/201

(58) Field of Classification Search ............ 365/185.14, 365/185.05, 185.26, 201, 189.08, 230.06
See application file for complete search history.

(56) References Cited

U.S. PATENT DOCUMENTS

| 4,999,813 | A | 3/1991 | Ohtsuka et al. |
| 6,128,219 | A | 10/2000 | Pio et al. |
| 6,816,421 | B2 * | 11/2004 | Tanzawa et al. .............. 365/201 |
| 7,099,211 | B2 * | 8/2006 | Jeong et al. .................. 365/201 |

FOREIGN PATENT DOCUMENTS

| JP | 1-113999 | 5/1989 |
| JP | 2005-310303 | 11/2005 |

* cited by examiner

*Primary Examiner*—Anh Phung
*Assistant Examiner*—Toan Le
(74) *Attorney, Agent, or Firm*—Oblon, Spivak, McClelland, Maier & Neustadt, P.C.

(57) ABSTRACT

A semiconductor memory device includes a memory cell, a word line, a bit line, a column gate, and a power supply decode circuit. The memory cell has a first MOS transistor including a charge accumulation layer and a control gate. The bit line is connected to a drain of the first MOS transistor and is applied with first voltage at the test operation time and at data program operation time. The column gate includes a second MOS transistor having current path connected to the bit line to transfer the first voltage to the bit line at the test operation time. The power supply decode circuit applies a second voltage to a gate of the second MOS transistor at the program operation time and applies a third voltage lower than the second voltage at the test operation time.

11 Claims, 9 Drawing Sheets

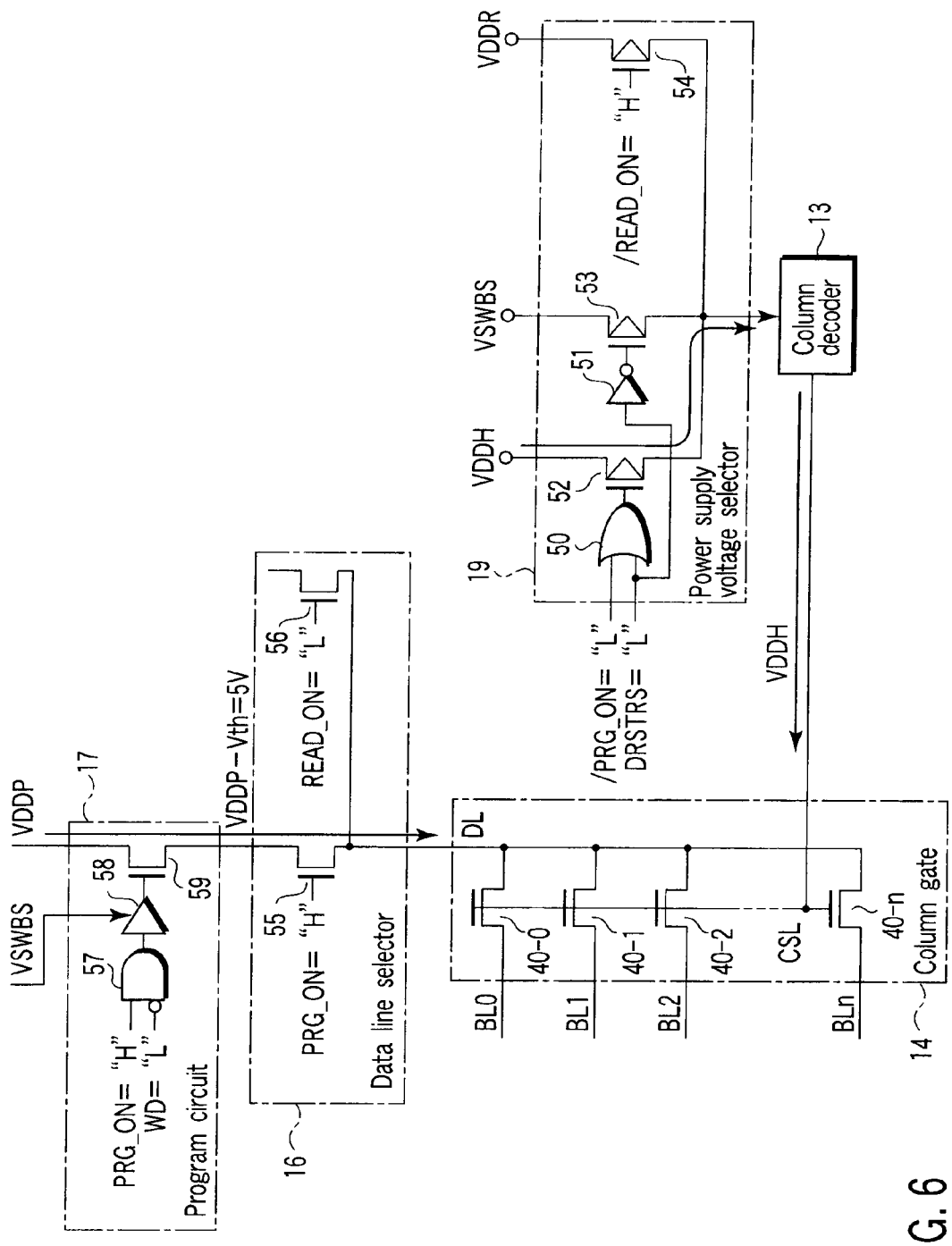
F I G. 6

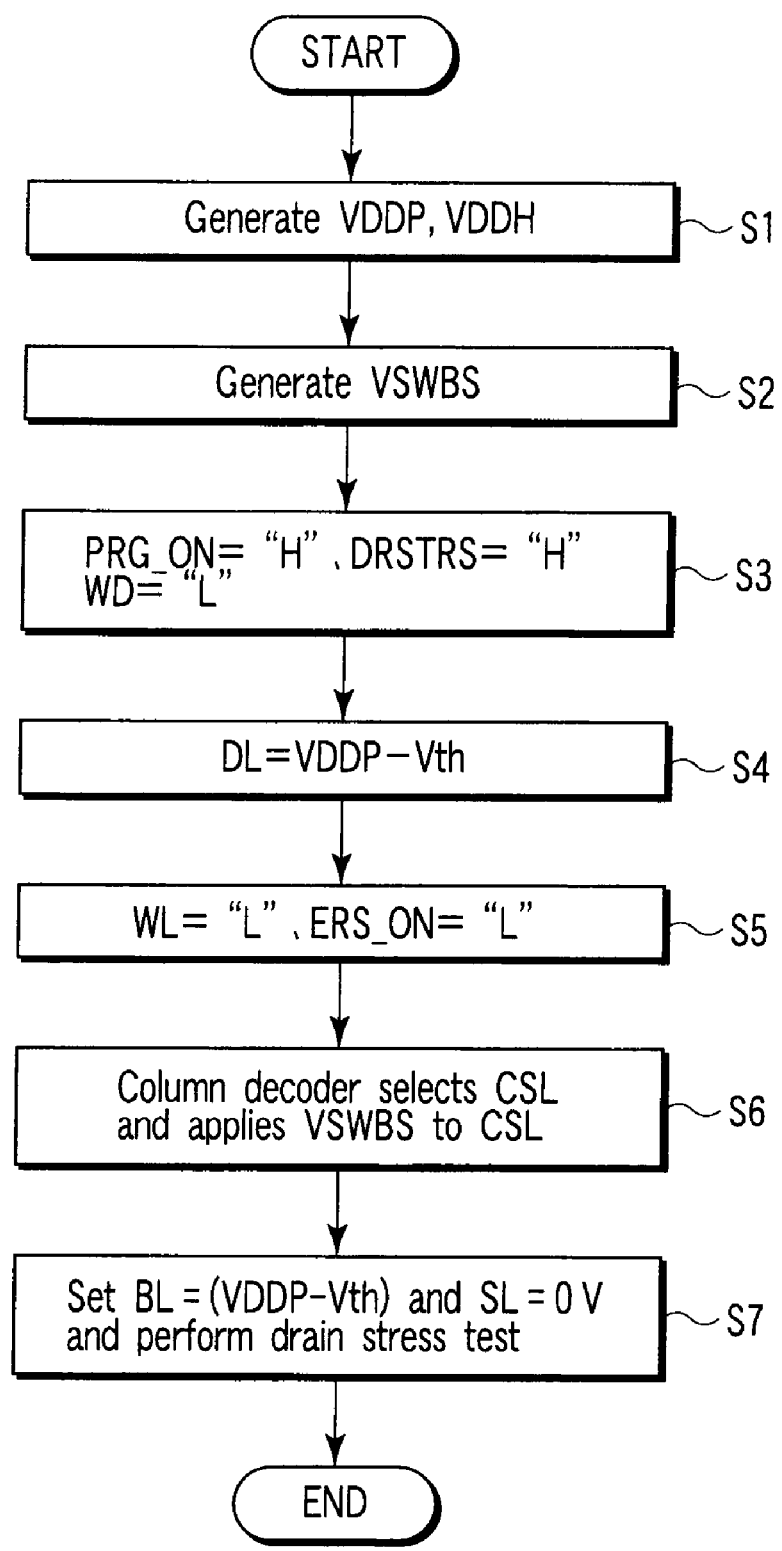
F I G. 8

SEMICONDUCTOR MEMORY DEVICE HAVING STACKED GATE INCLUDING CHARGE ACCUMULATION LAYER AND CONTROL GATE AND TEST METHOD THEREOF

CROSS-REFERENCE TO RELATED APPLICATIONS

This application is based upon and claims the benefit of priority from prior Japanese Patent Application No. 2006-171856, filed Jun. 21, 2006, the entire contents of which are incorporated herein by reference.

BACKGROUND OF THE INVENTION

1. Field of the Invention

This invention relates to a semiconductor memory device and a test method thereof and, for example, to a semiconductor memory having stacked gate including charge accumulation layer and control gate.

2. Description of the Related Art

Conventionally, a NOR flash memory is known as an electrically data rewritable nonvolatile semiconductor memory. In the NOR flash memory, a drain stress test is made before shipment in order to attain the high reliability of the operation thereof. The drain stress test is to apply voltage to the drain of the memory cell and check whether a leakage of charges occurs or not.

Conventionally, a method of applying program voltage at the drain stress test time to a bit line by use of the same path as that used at the normal program time in order to make the drain stress test is proposed in Jpn. Pat. Appln. KOKAI Publication No. 2005-310303, for example. However, with the configuration disclosed in the above Publication, there occurs a problem that the potential of a bit line is lowered if a failure in which another bit line is shorted to ground potential occurs, for example. The reason is that the conductive resistance of the column gate is low.

BRIEF SUMMARY OF THE INVENTION

A semiconductor memory device according to an aspect of the present invention includes:

a memory cell which has a first MOS transistor including a charge accumulation layer and a control gate formed on the charge accumulation layer;

a word line which is connected to the control gate of the first MOS transistor and is set in a non-selected state at a test operation time of the memory cell;

a bit line which is connected to a drain of the first MOS transistor and is applied with first voltage at the test operation time and at a data program operation time with respect to the memory cell;

a source line which is connected to a source of the first MOS transistor and is set at potential lower than that of the bit line at the test operation time;

a column gate including a second MOS transistor having current path connected to the bit line to transfer the first voltage to the bit line at the test operation time; and a power supply decode circuit which applies a second voltage to a gate of the second MOS transistor at the program operation time and applies a third voltage lower than the second voltage at the test operation time.

A test method for a semiconductor memory device according to another aspect of the present invention which includes a memory cell having a first MOS transistor including a charge accumulation layer and a control gate formed on the charge accumulation layer, a bit line connected to a drain of the first MOS transistor, a second MOS transistor which selects the bit line and a source line connected to a source of the memory cell, includes:

causing first and second voltage generating circuits to respectively generate first and second voltages;

causing a program circuit to convert the second voltage to a third voltage lower than the second voltage with the first voltage used as a reference and apply the third voltage to a data line;

causing a column decoder to connect the data line to the bit line by applying the first voltage to the gate of the second MOS transistor; and making a stress test of the memory cell by applying the third voltage to the bit line via the second MOS transistor, setting the control gate into a non-selected state and setting a potential of the source line to a potential lower than the third voltage.

BRIEF DESCRIPTION OF THE SEVERAL VIEWS OF THE DRAWING

FIG. 6 is a circuit diagram of the column gate, data line selector, program circuit, column decoder and power supply voltage selector provided in the NOR flash memory according to the embodiment of this invention, for illustrating the state set at the program operation time;

FIG. 8 is a flowchart for illustrating a drain stress test of the NOR flash memory according to the embodiment of this invention;

DETAILED DESCRIPTION OF THE INVENTION

There will now be described an embodiment of this invention with reference to the accompanying drawings. In the following explanation, the state in which charges are stored in the charge accumulation layer is defined as a "program state" and the state in which charges are extracted is defined as an "erase state".

Figure 1:
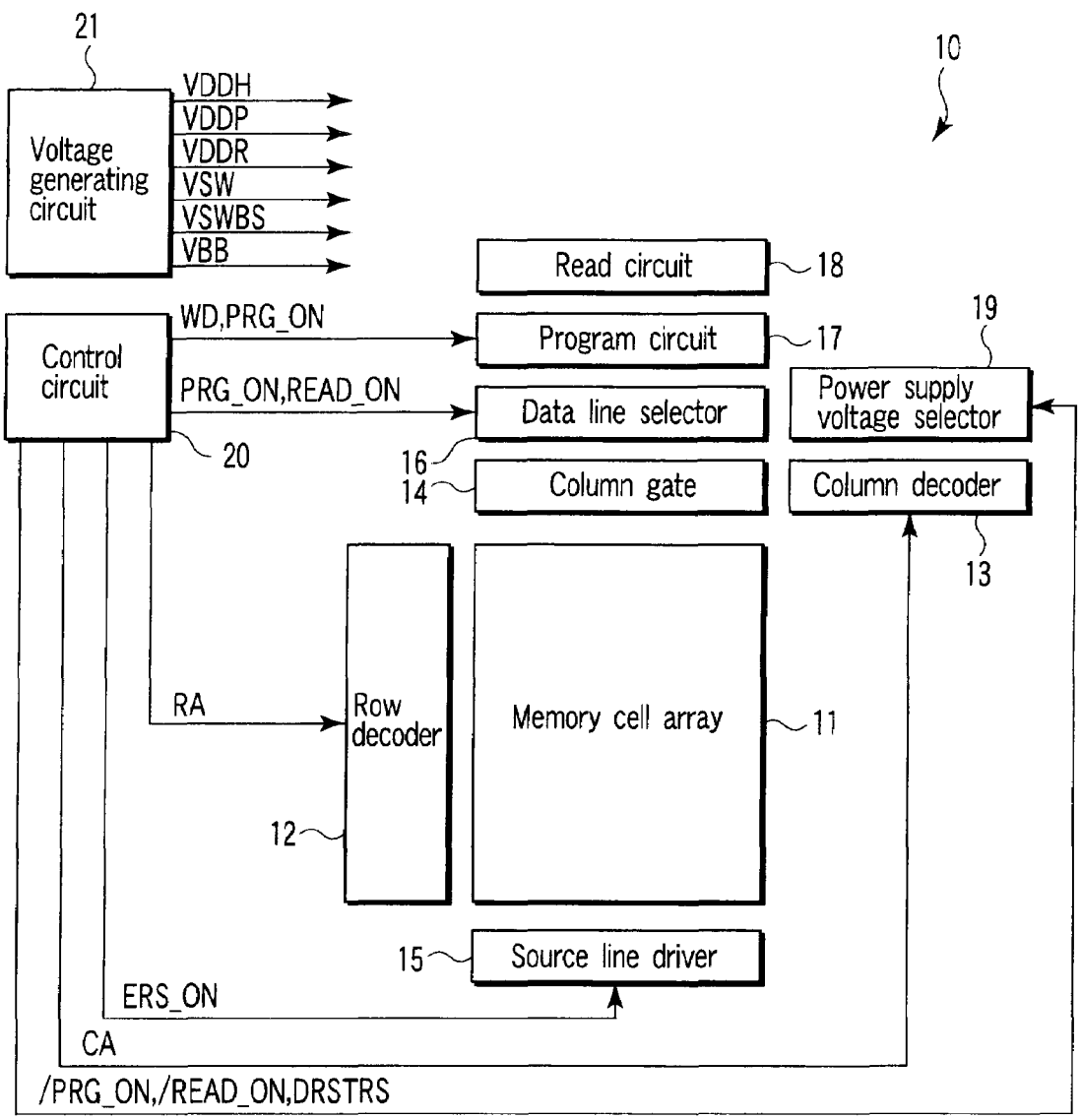
FIG. 1 is a block diagram of a NOR flash memory according to an embodiment of this invention.

A semiconductor memory device and a test method thereof according to one embodiment of this invention are explained below. FIG. 1 is a block diagram of a NOR flash memory according to the present embodiment. As shown in FIG. 1, a flash memory 10 includes a memory cell array 11, row decoder 12, column decoder 13, column gate 14, source line driver 15, data line selector 16, program circuit 17, read circuit 18, power supply voltage selector 19, control circuit 20 and voltage generating circuit 21.

The memory cell array 11 has a plurality of NOR flash memory cells arranged in a matrix form. The memory cells are connected to bit lines, word lines and a source line. The row decoder 12 selects the row direction of the memory cell array 11. That is, it selects one of the word lines. The column decoder 13 selects the column direction of the memory cell array 11. The column gate 14 selects a bit line based on the selection operation of the column decoder 13 to connect the thus selected bit line to a data line. The source line driver 15 applies voltage to the source line. The data line selector 16 connects the data line to the program circuit 17 or read circuit 18. The program circuit 17 applies voltage corresponding to program data to the data line. The read circuit 18 senses and amplifies data read onto the data line. The power supply voltage selector 19 selects voltage to be applied to the column decoder 13. The control circuit 20 controls the operation of the above circuit blocks. The voltage generating circuit 21 generates voltage VDDH (for example, 10 V), voltage VDDP (for example, 7 V), voltage VDDR (for example, 4.5 V), voltage VSW (for example, 2 to 10 V), voltage VSWBS (for example, 7.5 V) and voltage VBB (for example, −7.5 V).

Figure 2:
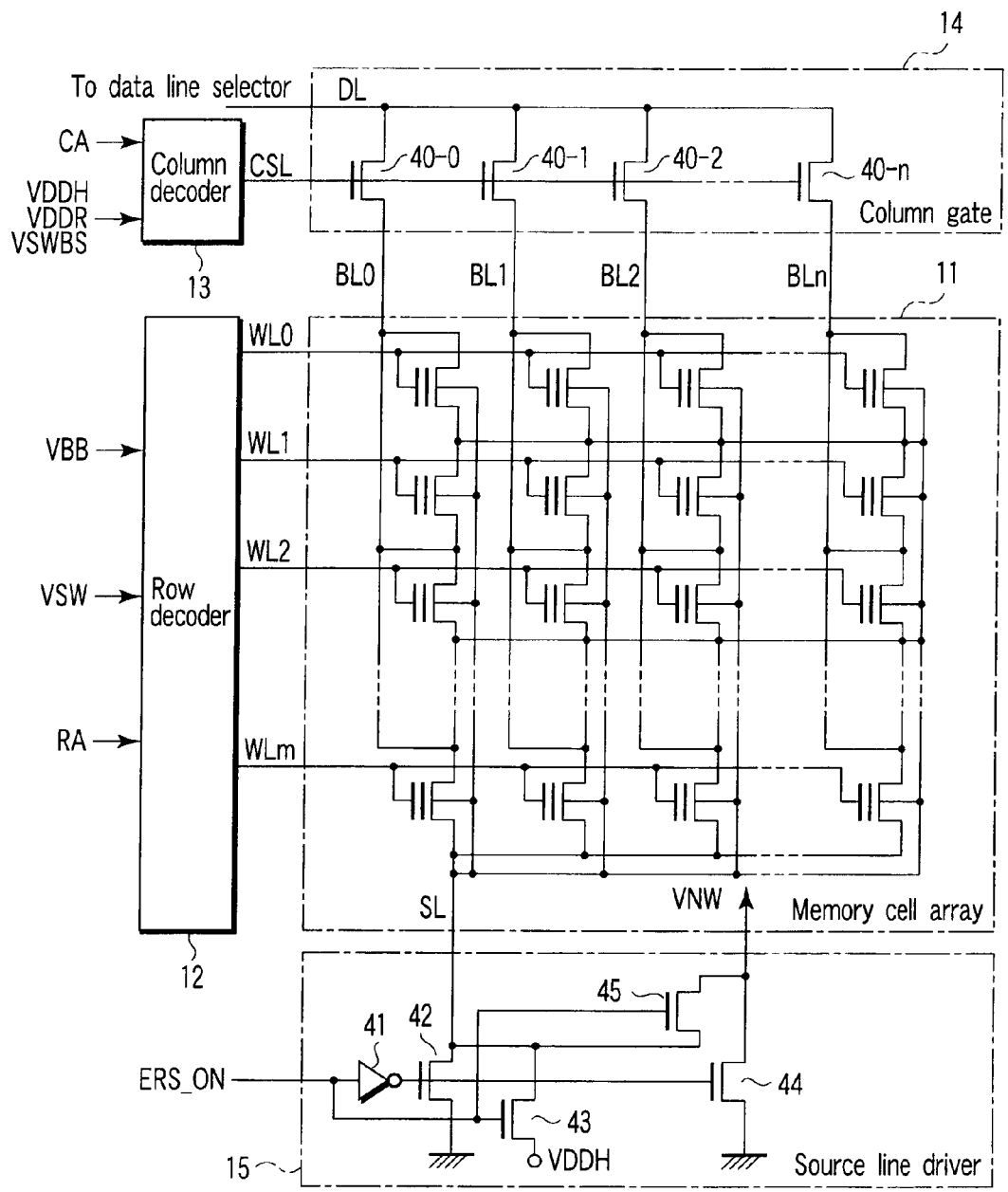
FIG. 2 is a circuit diagram of a memory cell array, column gate, source line driver, column decoder and row decoder provided in the NOR flash memory according to the embodiment of this invention.

Next, the configurations of the memory cell array 11, row decoder 12, column decoder 13, column gate 14 and source line driver 15 are explained with reference to FIG. 2. FIG. 2 is a circuit diagram of the memory cell array 11, row decoder 12, column decoder 13, column gate 14 and source line driver 15.

First, the memory cell array 11 is explained. As shown in FIG. 2, the memory cell array 11 includes ((m+1)×(n+1)) (m, n are natural numbers) memory cells MC. The memory cell MC is a MOS transistor having a stacked gate which includes a charge accumulation layer (for example, a floating gate in the present embodiment) and a control gate. The control gates of the memory cells MC which are arranged on the same row are commonly connected to a corresponding one of word lines WL0 to WLm. Further, the drains of the memory cells MC which are arranged on the same column are commonly connected to a corresponding one of bit lines BL0 to BLn. In addition, the sources of the memory cells MC are commonly connected to the same source line SL. For convenience sake in the following explanation, the word lines WL0 to WLm may be referred to as word lines WL and the bit lines BL0 to BLn may be referred to as bit lines BL in some cases.

Figure 3:
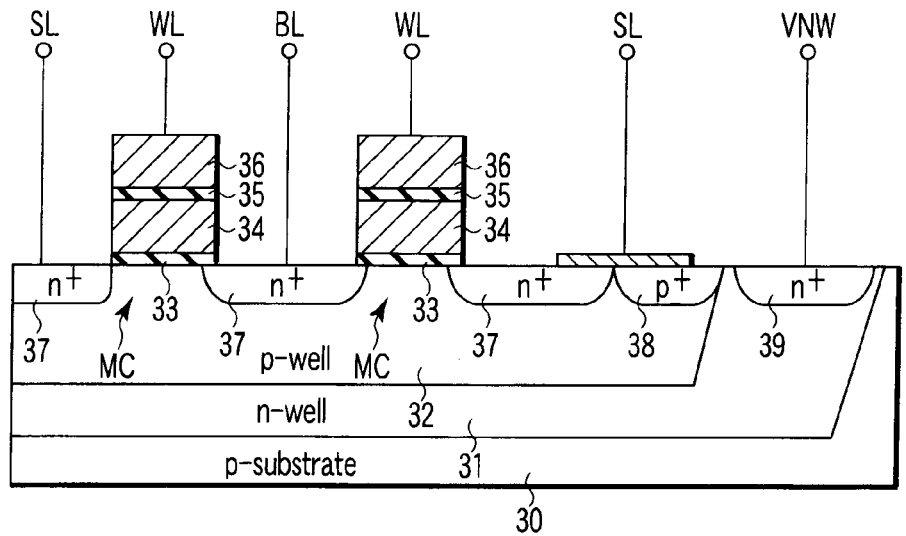
FIG. 3 is a cross sectional view of the memory cell array provided in the NOR flash memory according to the embodiment of this invention.

The cross section of the memory cell MC is explained with reference to FIG. 3. FIG. 3 is a cross sectional view showing a partial area of the memory cell array 11. As shown in FIG. 3, an n-well region 31 is formed in the surface area of a p-type semiconductor substrate 30 and a p-well region 32 is formed in the surface area of the n-well region 31. Further, gate insulating films 33 are formed on the p-well region 32 and gate electrodes of the memory cells MC are respectively formed on the gate insulating films 33. The gate electrode of the memory cell MC includes a polysilicon layer 34 formed on the gate insulating film 33 and a polysilicon layer 36 formed on the polysilicon layer 34 with a inter-gate insulating film 35 interposed therebetween. The inter-gate insulating film 35 is formed of a silicon oxide film or an ON film, NO film or ONO film having a laminated structure of a silicon oxide film and silicon nitride film. The polysilicon layers 34 function as floating gates (FG) and separated for each memory cell MC. Further, the polysilicon layers 36 which are arranged adjacent in a direction perpendicular to the bit line are connected together and function as a control gate (word line WL). In each of the surface areas of portions of the p-well region 32 which lie between the adjacent gate electrodes, an $n^+$-type impurity diffusion layer 37 is formed. The impurity diffusion layer 37 is commonly used by the adjacent transistors and functions as a source region or drain region. The source region of the memory cell MC is connected to the source line SL and the drain region is connected to the bit line BL. Further, a $p^+$-type impurity diffusion layer 38 is formed in the surface area of the p-well region 32 and an $n^+$-type impurity diffusion layer 39 is formed in the surface area of the n-well region 31. The same potential as that of the source line SL is applied to the p-well region 32 via the impurity diffusion layer 38 and well voltage VNW is applied to the n-well region 31 via the impurity diffusion layer 39.

The explanation is continuously made with reference to FIG. 2 again. The row decoder 12 selects one of the word lines WL based on a row address signal RA at the data programming operation time and read operation time and applies the voltage VSW to the selected word line. Further, at the data erase operation time, it selects all of the word lines WL and applies the negative voltage VBB to all of the word lines WL. In addition, it sets all of the word lines WL into the non-selected state (0 V) at the stress test time.

Next, the column gate 14 is explained. As shown in FIG. 2, the column gate 14 has n-channel MOS transistors 40-0 to 40-$n$ respectively provided for the bit lines BL0 to BLn. One-side ends of the current paths of the MOS transistors 40-0 to 40-$n$ are respectively connected to the bit lines BL0 to BLn and the other ends thereof are commonly connected to the data line DL. Further, the gates thereof are connected to a column selection line CSL. For convenience sake, in FIG. 2, all of the MOS transistors 40-0 to 40-$n$ are connected to the same column selection line CSL, but they may be connected to different column selection lines CSL.

Next, the column decoder 13 is explained. The column decoder 13 selects the column selection line CSL based on a column address signal CA at the data programming operation time and read operation time. It applies voltage VDH to the selected column selection line CSL at the program operation time and applies voltage VDDR at the read operation time. Further, at the data erase operation time, it sets the column selection line CSL in the non-selected state (0 V). In addition, it applies the voltage VSWB to the column selection line CSL at the stress test time to set all of the MOS transistors 40-0 to 40-$n$ in the ON state.

Next, the source line driver 15 is explained. The source line driver 15 includes an inverter 41 and n-channel MOS transistors 42 to 45. The inverter 41 inverts an erase signal ERS_ON supplied from the control circuit 20 to generate an inverted erase signal /ERS_ON. The erase signal ERS_ON is set to a high level "H" at the erase operation time. The source of the MOS transistor 42 is connected to a ground potential node, the drain thereof is connected to the source line SL and the gate is supplied with the signal /ERS_ON. The drain of the MOS transistor 43 is applied with the voltage VDDH, the source thereof is connected to the source line SL and the gate is supplied with the signal ERS_ON. The MOS transistors 44, 45 supply well voltage VNW of the n-well region 31. The source of the MOS transistor 45 is connected to the source line SL, the drain thereof is connected to the n-well region 31 and the gate is supplied with the signal ERS_ON. The source of the MOS transistor 44 is connected to the ground potential node, the drain thereof is connected to the n-well region 31 and the gate thereof is supplied with the signal /ERS_ON.

Figure 4:
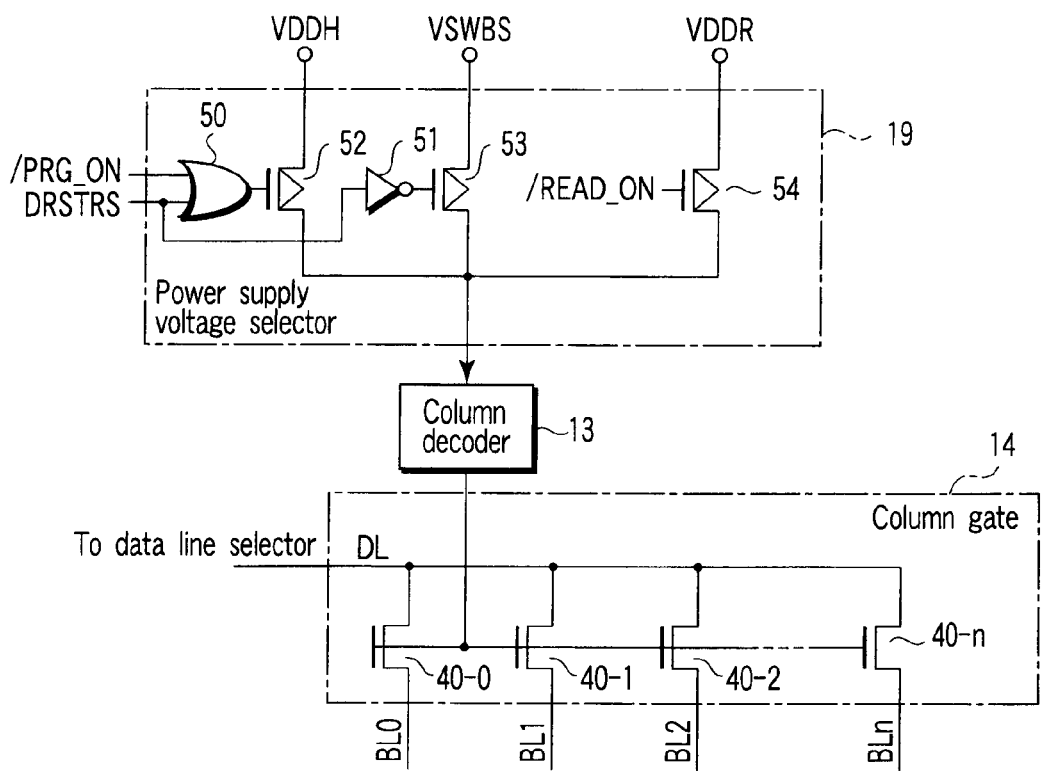
FIG. 4 is a circuit diagram of the column gate, column decoder and power supply voltage selector provided in the NOR flash memory according to the embodiment of this invention.

Next, the configuration of the power supply voltage selector 19 is explained with reference to FIG. 4. FIG. 4 is a circuit diagram of the power supply voltage selector 19, column decoder 13 and column gate 14. As shown in FIG. 4, the power supply voltage selector 19 includes an OR gate 50, inverter 51 and p-channel MOS transistors 52 to 54. The OR gate 50 calculates the logical OR of an inverted program signal /PRG_ON and a test signal DRSTRS. A program signal PRG_ON is a signal set at the high level "H" at the program operation time and at the drain stress test time and the test signal DRSTRS is a signal set at the high level "H" at the drain stress test time. The inverter 51 inverts the signal DRSTRS. The source of the MOS transistor 52 is applied with the voltage VDDH, the drain thereof is connected to the column decoder 13 and the gate is supplied with the result of the operation in the OR gate 50. The source of the MOS transistor 53 is applied with the voltage VSWBS, the drain thereof is connected to the column decoder 13 and the gate is supplied with an output signal of the inverter 51. The source of the MOS transistor 54 is applied with the voltage VDDR, the drain thereof is connected to the column decoder 13 and the gate is supplied with an inverted read signal /READ_ON. A read signal READ_ON is supplied from the control circuit 20 and set at the high level "H" at the read operation time. With the above configuration, the MOS transistor 52 is set in the ON state at the program operation time and the voltage VDDH is applied to the column decoder 13. Further, the MOS transistor 54 is set in the ON state at the read operation time and the voltage VDDR is applied to the column decoder 13. In addition, the MOS transistor 53 is set in the ON state at the drain stress test time and the voltage VSWBS is applied to the column decoder 13. Then, the column decoder 13 applies one of the voltages VDDH, VSWBS and VDDR supplied from the power supply voltage selector 19 to the selected column selection line CSL.

Figure 5:
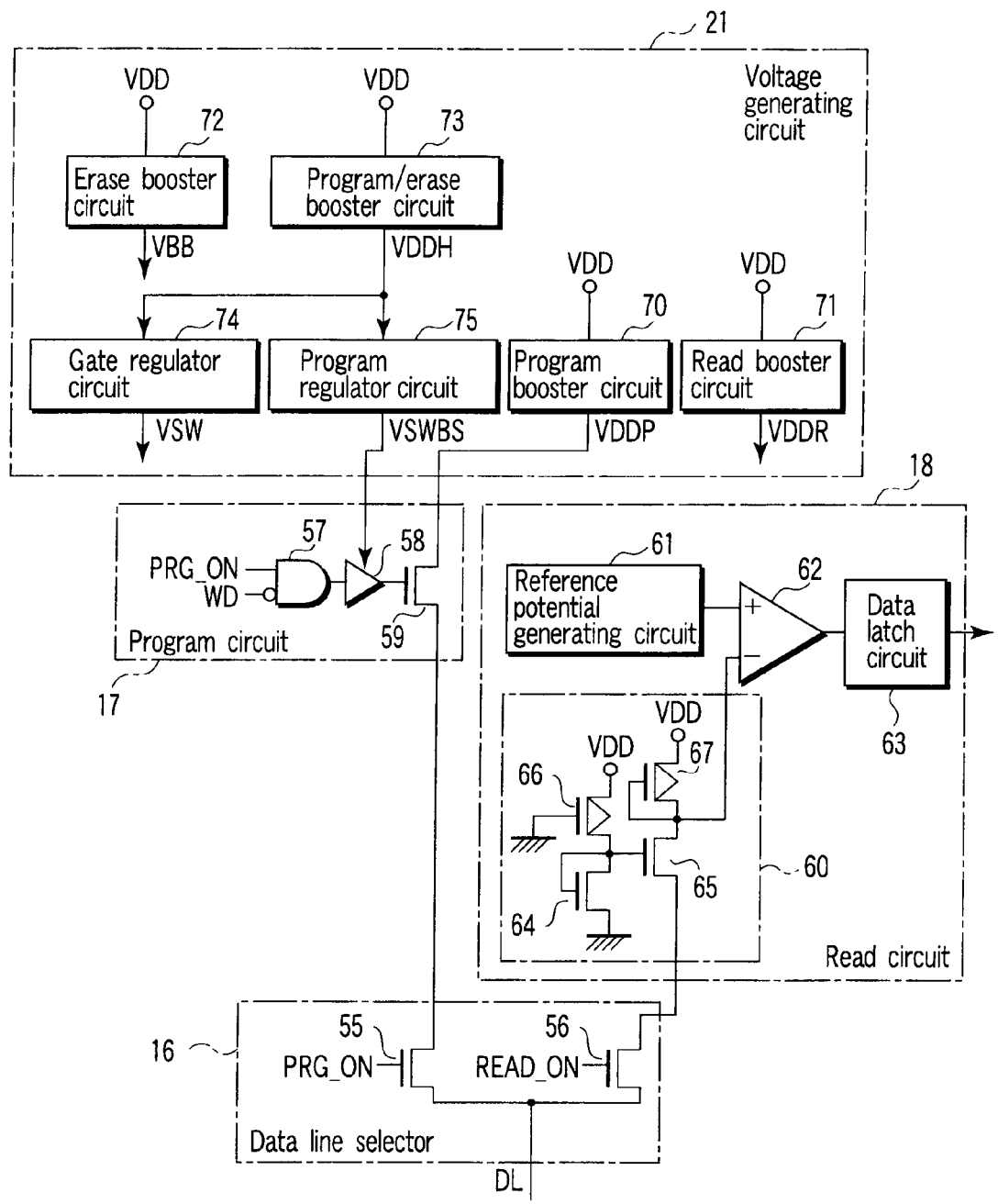
FIG. 5 is a circuit diagram of a data line selector, program circuit, read circuit and voltage generating circuit provided in the NOR flash memory according to the embodiment of this invention.

Next, the data line selector 16, program circuit 17, read circuit 18 and voltage generating circuit 21 are explained with reference to FIG. 5. FIG. 5 is a circuit diagram of the data line selector 16, program circuit 17, read circuit 18 and voltage generating circuit 21.

First, the data line selector 16 is explained. The data line selector 16 includes n-channel MOS transistors 55, 56. One end of the current path of the MOS transistor 55 is connected to the data line DL and the other end thereof is connected to the program circuit 17 and the gate is supplied with the signal PRG_ON. One end of the current path of the MOS transistor 56 is connected to the data line DL and the other end thereof is connected to the read circuit 18 and the gate is supplied with the signal READ_ON. Therefore, the data line DL is connected to the program circuit 17 via the MOS transistor 55 at the drain stress test time and connected to the read circuit 18 via the MOS transistor 56 at the read operation time.

Next, the program circuit 17 is explained. As shown in FIG. 5, the program circuit 17 includes an AND gate 57, driver circuit 58 and n-channel MOS transistor 59. The AND gate 57 calculates the logical AND of the signal PRG_ON and an inverted signal of program data WD. The driver circuit 58 controls an output signal level of the AND gate 57 according to the voltage VSWBS to supply the output signal to the gate of the MOS transistor 59. The source of the MOS transistor 59 is connected to the other end of the current path of the MOS transistor 55 of the data line selector 16 and the drain thereof is applied with the voltage VDDP. With the above configuration, output voltage of the driver circuit 58 is set to a value which permits the source potential of the MOS transistor 59 to become substantially equal to (VDDP-Vth). In other words, the voltage value of the voltage VSWBS is set so that the output voltage of the driver circuit 58 may satisfy the above condition. As one example, (VDDP-Vth) is set to 5 V in a condition of VDDP=7 V and VSWBS=7.5 V.

Next, the read circuit 18 is explained. As shown in FIG. 5, the read circuit 18 includes a precharge circuit 60, reference potential generating circuit 61, comparator 62 and data latch circuit 63. The precharge circuit 60 includes n-channel MOS transistors 64, 65 and p-channel MOS transistors 66, 67. The source of the MOS transistor 64 is connected to the ground potential node and the gate and drain thereof are connected together. The source of the MOS transistor 66 is applied with the voltage VDD, the gate thereof is connected to the ground potential node and the drain thereof is connected to the drain of the MOS transistor 64. The source of the MOS transistor 65 is connected to the other end of the current path of the MOS transistor 56 of the data line selector 16 and the gate thereof is connected to a common connection node of the drain of the MOS transistor 64 and the drain of the MOS transistor 66. The source of the MOS transistor 67 is applied with the voltage VDD and the gate and drain thereof are connected to the drain of the MOS transistor 65.

The reference potential generating circuit 61 generates reference potential used to determine whether read data is "0" or "1". The comparator 62 compares potential of the common connection node of the drain of the MOS transistor 65 and the drain of the MOS transistor 67 with the reference potential generated by the reference potential generating circuit 61. The data latch circuit 63 latches the comparison result obtained by the comparator 62. With the above configuration, the MOS transistor 67 of the precharge circuit 60 precharges the bit lines via the data line selector 16 and column gate 14. After the precharge operation, a potential variation caused by reading data onto the bit line is sensed and amplified by the comparator 62.

Further, the voltage generating circuit 21 is explained with reference to FIG. 5. As shown in FIG. 5, the voltage generating circuit 21 includes a program booster circuit 70, read booster circuit 71, erase booster circuit 72, program/erase booster circuit 73, gate regulator circuit 74 and program regulator circuit 75. The program booster circuit 70, read booster circuit 71, erase booster circuit 72 and program/erase booster circuit 73 respectively generate positive voltage VDDP (7 V), positive voltage VDDR (4.5 V), positive voltage VDDH (10 V) and negative voltage VBB (-7.5 V). The gate regulator circuit 74 regulates the voltage VDDH to generate positive voltage VSW of approximately 2 to 10 V as required. The program regulator circuit 75 regulates the voltage VDDH to generate positive voltage VSWBS (7.5 V) required for controlling the MOS transistor 59 in the program circuit 17. As described before, the voltage VSWBS is also applied to the power supply voltage selector 19.

Next, the operation of the NOR flash memory with the above configuration is explained with much attention paid to the drain stress test in addition to the program operation and read operation thereof. The following explanation is made with attention paid to the column decoder 13, column gate 14, data line selector 16, program circuit 17, read circuit 18 and power supply voltage selector 19. First, the program operation and read operation are simply explained.

<Program Operation>

FIG. 6 is a circuit diagram of the column decoder 13, column gate 14, data line selector 16, program circuit 17 and power supply voltage selector 19 at the "0" data programming operation time. As shown in FIG. 6, the control circuit 20 sets the program signal PRG_ON to "H", sets the test signal DRSTRS to "L" and sets the read signal READ_ON to "L" at the program operation time. Further, program data WD="L" is input to the program circuit 17.

Then, the MOS transistor 55 in the data line selector 16 is set into the ON state, and therefore, the data line DL is electrically connected to the program circuit 17. On the other hand, since the MOS transistor 56 is set in the OFF state, the data line DL is electrically isolated from the read circuit 18. Then, the MOS transistor 59 in the program circuit 17 is set into the ON state. As a result, voltage (VDDP-Vth)=5 V is applied from the program circuit 17 to the data line DL. Further, since only the MOS transistor 52 in the power supply voltage selector 19 is set in the ON state, the voltage VDDH is applied to the column decoder 13.

After this, the column decoder 13 selects the selection line CSL and applies the voltage VDDH selected by the power supply voltage selector 19 to the selected column selection line CSL. As a result, the data line DL is electrically connected to the bit line BL. Then, "0" data is programmed into the memory cell MC connected to the word line selected by the row decoder 12.

<Read Operation>

Figure 7:
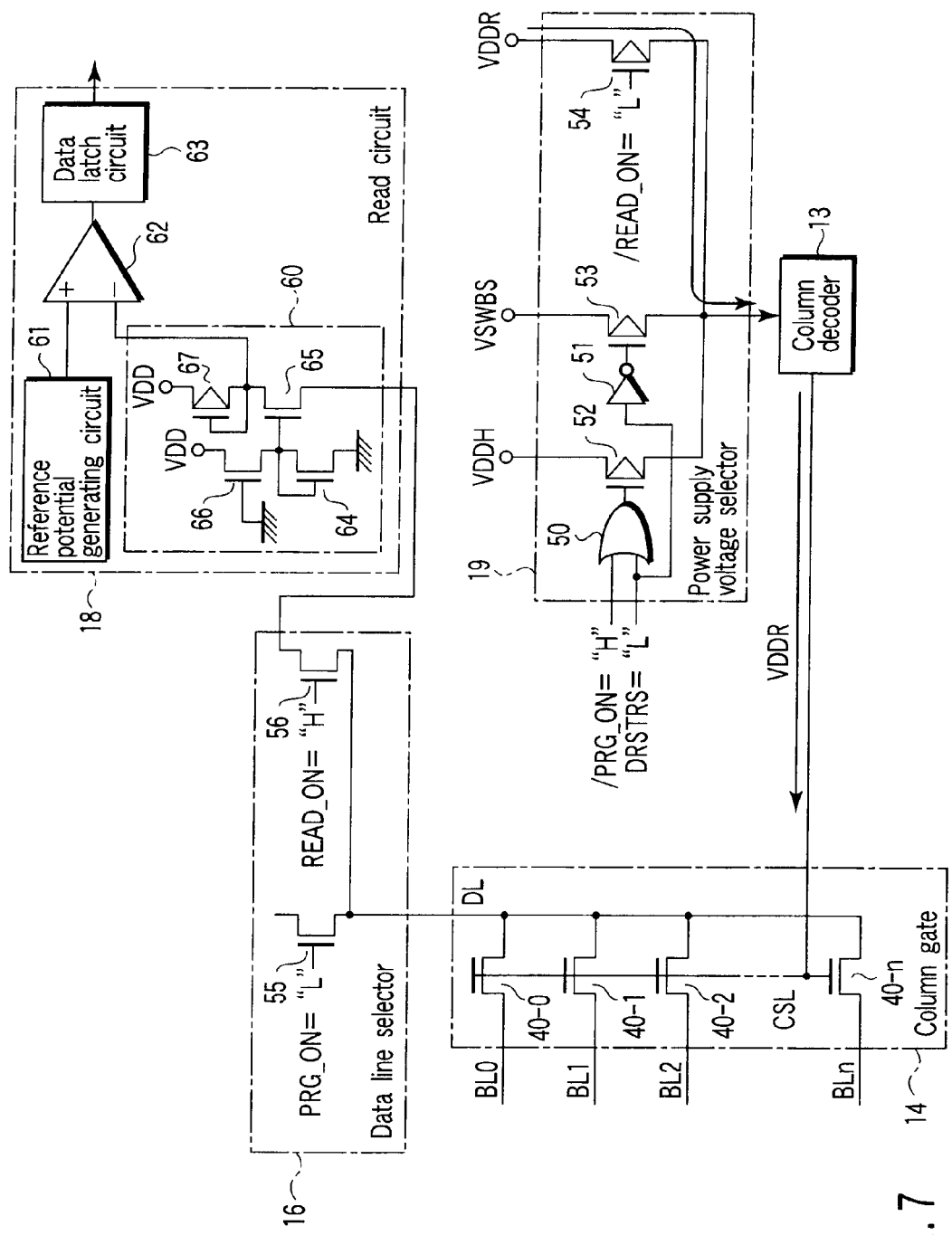
FIG. 7 is a circuit diagram of the column gate, data line selector, read circuit, column decoder and power supply voltage selector provided in the NOR flash memory according to the embodiment of this invention, for illustrating the state set at the read operation time.

Next, the read operation is explained with reference to FIG. 7. FIG. 7 is a circuit diagram of the column decoder 13, column gate 14, data line selector 16, read circuit 18 and power supply voltage selector 19 at the read operation time. As shown in FIG. 7, the control circuit 20 sets the program signal PRG_ON to "L", sets the test signal DRSTRS to "L" and sets the read signal READ_ON to "H" at the read operation time.

Then, the MOS transistor 56 in the data line selector 16 is set into the ON state, and therefore, the data line DL is electrically connected to the read circuit 18. On the other hand, since the MOS transistor 55 is set in the OFF state, the data line DL is electrically isolated from the program circuit 17. Further, since only the MOS transistor 54 in the power supply voltage selector 19 is set in the ON state, the voltage VDDR is applied to the column decoder 13. Then, the column decoder 13 selects the selection line CSL and applies voltage VDDR selected by the power supply voltage selector 19 to the selected column selection line CSL. As a result, the data line DL is electrically connected to the bit line BL.

After this, the bit line BL is precharged via the data line DL by use of the MOS transistor 67 in the read circuit 18. When the potential of the bit line has reached preset potential, the precharging operation is terminated. In this state, the row decoder 12 selects one of the word lines WL. Then, the potential of the bit line BL varies according to data held in the memory cell MC connected to the selected word line WL. The potential variation is sensed and amplified by the comparator 62 in the read circuit 18 and thus data is read out.

<Drain Stress Test>

Figure 9:
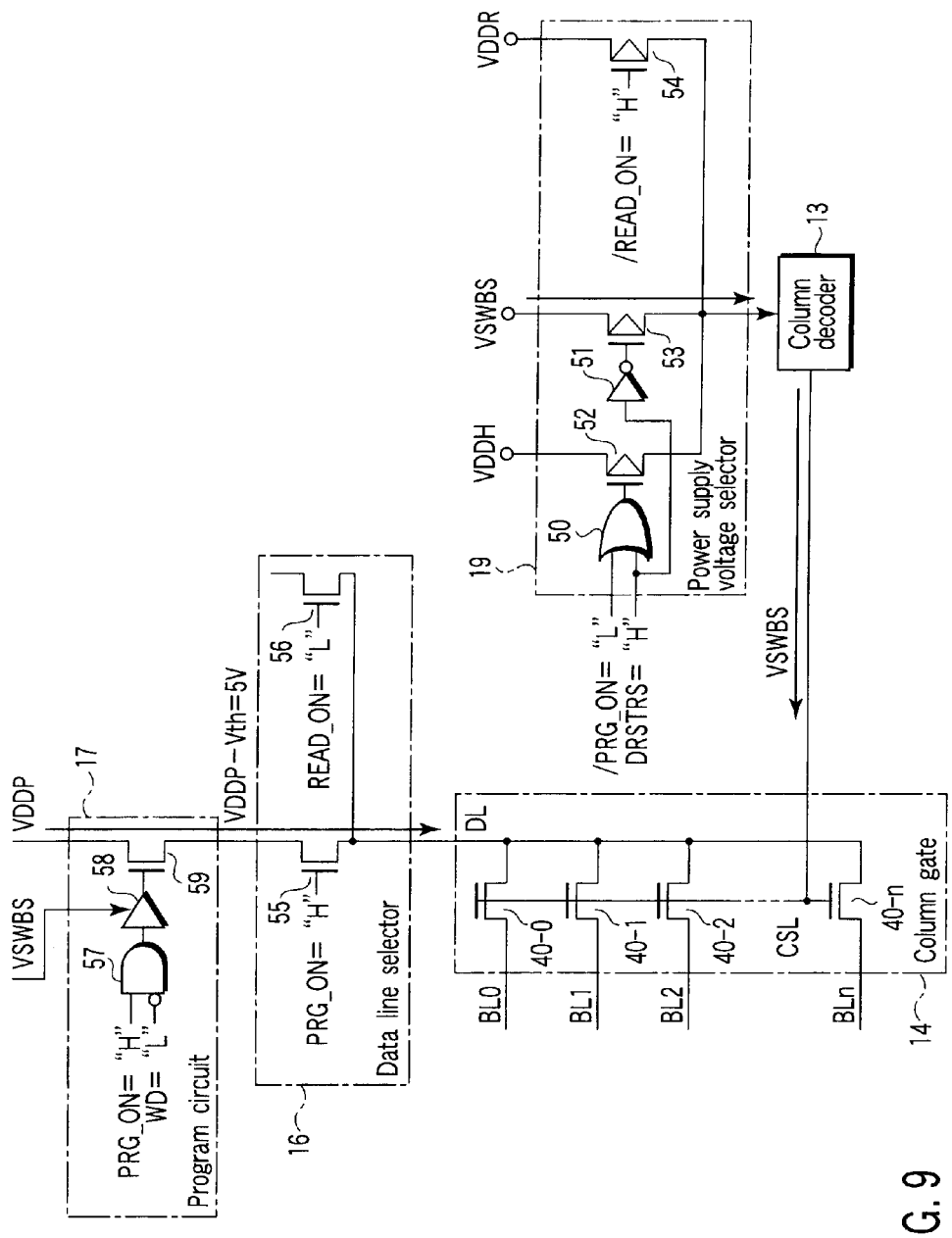
FIG. 9 is a circuit diagram of the column gate, data line selector, program circuit, column decoder and power supply voltage selector provided in the NOR flash memory according to the embodiment of this invention, for illustrating the state set at the drain stress test time.

Next, the drain stress test is explained with reference to FIGS. 8 and 9. FIG. 8 is a flowchart for illustrating the drain stress test and FIG. 9 is a circuit diagram of the column decoder 13, column gate 14, data line selector 16, program circuit 17 and power supply voltage selector 19 at the drain stress test time. The drain stress test is a test to check whether or not a failure (such as current leak) occurs in the memory cell or bit line by applying voltage between the bit line and the source line. Therefore, the bit line and source line are set in the voltage condition at the "0" data programming time and the word lines are set in the non-selected state. In the present embodiment, the voltage of the column selection line CSL is set lower than the voltage set at the program time.

First, the program booster circuit 70 and program/erase booster circuit 73 respectively generate voltage VDDP (7 V) and VDDH (10 V) (step S1). Further, the program regulator circuit 75 regulates the voltage VDDH to generate voltage VSWBS (7.5 V) (step S2).

Then, the control circuit 20 sets both of the program signal PRG_ON and test signal DRSTRS to the "H" level. Further, program data WD="L" is input to the program circuit 17 (step S3). As a result, as shown in FIG. 9, the MOS transistor 59 in the program circuit 17 is set into the ON state and the MOS transistor 55 in the data line selector 16 is set into the ON state. Therefore, the potential of the data line DL is set to voltage (VDDP-Vth)=5 V which is lowered from the voltage VDDP by the threshold voltage of the MOS transistor 59 (step S4). At this time, only the MOS transistor 53 in the power supply voltage selector 19 is set in the ON state. Therefore, the voltage VSWBS is applied to the column decoder 13.

Further, the row decoder 12 sets all of the word lines WL into the non-selected state and sets all of the word lines WL to the "L" level. In addition, the control circuit 20 maintains the erase signal ERS_ON at the "L" level (step S5).

Then, the column decoder 13 selects the column selection line CSL and applies the voltage VSWBS to the selected column selection line CSL (step S6). Thus, the data line DL is electrically connected to the bit line BL. That is, the potential of the bit line is set to (VDDP-Vth), the potential of the source line SL is set to 0 V and the drain stress test is performed. In this case, all of the bit lines BL may be connected to the data line DL or only some of the bit lines BL may be connected to the data line DL.

As described above, with the NOR flash memory according to the present embodiment of this invention, the following effects can be attained.

(1) The reliability of the drain stress test can be enhanced.

Figure 10:
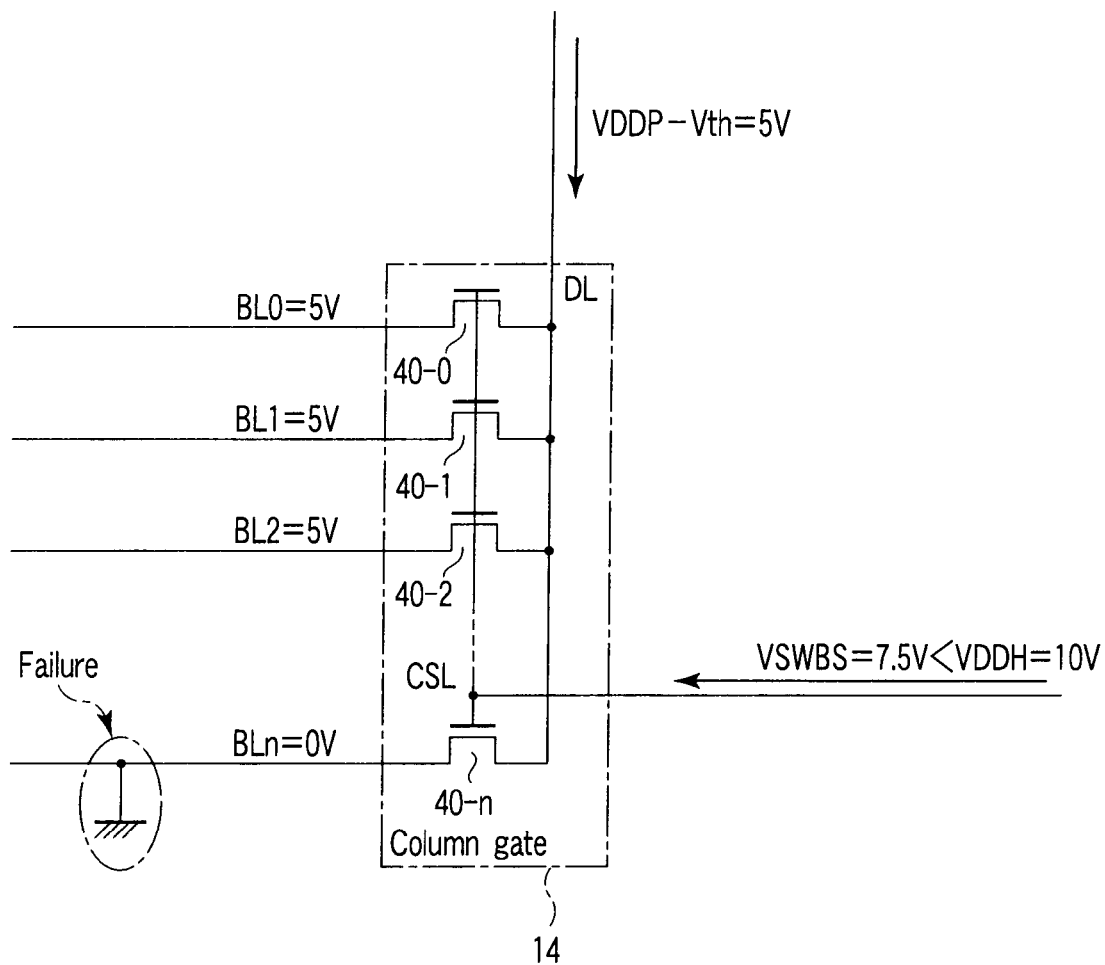
FIG. 10 is a circuit diagram of the column gate provided in the NOR flash memory according to the embodiment of this invention, for illustrating the state in which a bit line failure occurs.

In the NOR flash memory according to the present embodiment, the voltage (VSWBS) of the column selection line CSL at the drain stress test time is set lower than the voltage (VDDH) at the program time. Therefore, even if one of the bit lines BL is short-circuited, the other bit lines are difficult to be influenced by the short circuit. Thus, the precise drain stress test can be made. The present effect is explained with reference to FIG. 10. FIG. 10 is a circuit diagram showing the column gate 14 at the drain stress test time and the bit lines BL. Specifically, FIG. 10 shows the state in which a failure that the bit line BLn is short-circuited with the ground potential node occurs.

At the drain stress test time, the voltage VSWBS is applied from the power supply voltage selector 19 to the column decoder 13. Then, the column decoder 13 applies the voltage VSWBS to the column selection line CSL. The voltage VSWBS is set lower than the voltage VDDH applied to the column selection line CSL at the program time and is set to the minimum necessary value required for transferring the potential (VDDP-Vth) of the data line DL to the bit line BL.

Then, since the potential of the column selection line CSL is relatively low, the conductive resistance of the MOS transistors 40-0 to 40-$n$ in the column gate 14 becomes higher than that set at the program time. Therefore, even if the potential of the bit line BLn is short-circuited and set to 0 V, the potential of the data line DL is maintained substantially at the potential (VDDP-Vth) due to the voltage drop in the MOS transistor 40-$n$. Thus, the potentials of the bit lines BL0 to BL(n−1) other than the bit line BLn are set at approximately 5 V and the drain stress test for the bit lines BL0 to BL(n−1) can be correctly performed.

If the potential of the column selection line CSL at the drain stress test time is set at the same voltage as the voltage VDDH at the program time, the conductive resistance of the MOS transistors 40-0 to 40-n is set sufficiently low. This is because the sizes (for example, the gate widths) of the MOS transistors 40-0 to 40-n are generally made large in order to efficiently transfer program data to the bit line at the program time. The size (for example, the gate width) of each of the MOS transistors 40-0 to 40-n is larger than that of at least the memory cell MC. Therefore, if the bit line BLn is short-circuited and set to 0 V, the potential of the data line DL is set to approximately 0 V accordingly. Thus, the potentials of the bit lines BL0 to BL(n−1) in which no failure occurs are set to 0 V, thereby making it difficult to correctly perform the drain stress test for the bit lines BL0 to BL(n−1). In other words, it may be determined that the bit lines BL0 to BL(n−1) in which no failure occurs are defective due to a lowering in the potential.

However, in the present embodiment, the conductive resistance of the MOS transistors 40-0 to 40-n is controlled by controlling the potential of the column selection line CSL at the drain stress test time. Therefore, the conductive resistance of the MOS transistors 40-0 to 40-n at the drain stress test time can be set high so as not to exert an influence on the other bit lines while the sizes of the MOS transistors 40-0 to 40-n are set sufficiently large to efficiently transfer data at the program time.

(2) An increase in the chips area can be suppressed.

With the configuration according to the present embodiment, the drain voltage of the memory cell at the drain stress test time is applied via the path which is the same path used at the program time. Therefore, it is unnecessary to additionally provide MOS transistors exclusively used for the bit lines unlike the conventional case and an increase in the chip area can be suppressed.

Further, as the voltage VSWBS applied to the column selection line CSL at the drain stress test time, voltage used for controlling the driver circuit 58 in the program circuit 17 can be used. The voltage VSWBS is set to a voltage value which permits the driver circuit 58 to control the gate voltage of the MOS transistor 59 so as to set the source potential of the MOS transistor 59 to the potential (VDDP-Vth)=5 V. In other words, the voltage VSWBS is voltage which permits the control circuit 59 to pass 5 V therethrough.

On the other hand, the voltage applied from the column decoder 13 to the column selection line CSL at the drain stress test time is the lowest voltage which can permit the MOS transistors 40-0 to 40-n in the column gate 14 to pass 5 V therethrough.

That is, the condition required for the voltage VSWBS applied to the driver circuit 58 is equal to the condition required for the voltage applied to the column selection line CSL at the drain stress test time. Therefore, the voltage VSWBS can be used as the voltage applied to the column selection line CSL. Thus, it is not necessary to provide a booster circuit which generates a new voltage value in the voltage generating circuit 21. The present embodiment can be realized simply by adding the inverter 51 and MOS transistor 53 in the power supply voltage selector 19. Therefore, the effect (1) can be attained while an increase in the chip area is suppressed.

In the present embodiment, a case wherein the NOR flash memory is taken as an example is explained, but embodiment is not limited to the above embodiment. For example, this invention can be applied to a flash memory in which data can be programmed by use of FN tunneling. Further, for example, this invention can be applied to a NAND flash memory, a 3-Tr-NAND flash memory in which the number of memory cell transistors is set to one in the configuration of the NAND flash memory, a 2-Tr flash memory in which the selection transistors on the bit line side are removed in the configuration of the 3-Tr-NAND flash memory and the like.

The concrete voltage values explained in the above embodiment are given only as one example and can be adequately selected according to the circuit configuration. That is, it is sufficient if the voltage applied to the column selection line CSL at the drain stress test time is lower than the voltage applied at the program time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
a memory cell which has a first MOS transistor including a charge accumulation layer and a control gate formed on the charge accumulation layer;
a word line which is connected to the control gate of the first MOS transistor and is set in a non-selected state at a test operation time of the memory cell;
a bit line which is connected to a drain of the first MOS transistor and is applied with first voltage at the test operation time and at a data program operation time with respect to the memory cell;
a source line which is connected to a source of the first MOS transistor and is set at potential lower than that of the bit line at the test operation time;
a column gate including a second MOS transistor having current path connected to the bit line to transfer the first voltage to the bit line at the test operation time; and
a power supply decode circuit which applies a second voltage to a gate of the second MOS transistor at the program operation time and applies a third voltage lower than the second voltage at the test operation time.

2. The device according to claim 1, further comprising
a program voltage generating circuit which generates a fourth voltage higher than the first voltage;
a control voltage generating circuit which generates the third voltage; and
a program circuit which acquires the first voltage by controlling a voltage value of the fourth voltage according to the third voltage and applies the first voltage to the bit line via the column gate.

3. The device according to claim 2, further comprising a read voltage generating circuit which generates a fifth voltage;
wherein the power supply decode circuit includes
a column decoder which transfers a voltage to a gate of the second MOS transistor,
a first switching element which supplies the second voltage to the column decoder at the program operation time,
a second switching element which supplies the third voltage to the column decoder at the test operation time, and
a third switching element which supplies the fifth voltage to the column decoder at the data read operation time from the memory cell, and
the column decoder transfers a voltage supplied from one of the first to third switching elements to the gate of the second MOS transistor.

4. The device according to claim 2, wherein the program circuit includes
- a third MOS transistor having a current path which is applied with the fourth voltage at one end and connected at the other end to the bit lines via the column gate, and
- a driver circuit which controls a gate voltage of the third MOS transistor according to the third voltage.

5. The device according to claim 4, wherein the third voltage is set to a minimum required value which permits the second MOS transistor to transfer the first voltage to the bit line.

6. The device according to claim 4, wherein the first voltage is equal to a voltage obtained by lowering the fourth voltage by threshold voltage of the third MOS transistor.

7. The device according to claim 1, wherein a gate width of the second MOS transistor is larger than a gate width of the first MOS transistor.

8. A semiconductor memory device comprising:
- a plurality of first MOS transistors which hold data and each of which includes a charge accumulation layer and a control gate formed on the charge accumulation layer;
- a plurality of bit lines respectively connected to drains of the first MOS transistors and each applied with a first voltage at a test operation time and at a data program operation time with respect to the first MOS transistors;
- a source line commonly connected to sources of the plurality of first MOS transistors and set at a potential lower than that of the bit lines set at the test operation time;
- a plurality of second MOS transistors having current paths respectively connected to the bit lines to transfer the first voltage to a corresponding one of the bit lines at the test operation time; and
- a power supply decode circuit which applies a second voltage to gates of the second MOS transistors at the program operation time and applies a third voltage lower than the second voltage at the test operation time.

9. The device according to claim 8, further comprising
- a program voltage generating circuit which generates a fourth voltage higher than the first voltage;
- a control voltage generating circuit which generates the third voltage; and
- a program circuit which acquires the first voltage by controlling a voltage value of the fourth voltage according to the third voltage and applies the first voltage to the bit lines via the second MOS transistors.

10. The device according to claim 9, wherein the program circuit includes
- a third MOS transistor having a current path which is applied with the fourth voltage at one end and connected at the other end to the bit lines via the second MOS transistors, and
- a driver circuit which controls a gate voltage of the third MOS transistor according to the third voltage.

11. A test method for a semiconductor memory device which includes a memory cell having a first MOS transistor including a charge accumulation layer and a control gate formed on the charge accumulation layer, a bit line connected to a drain of the first MOS transistor, a second MOS transistor which selects the bit line and a source line connected to a source of the memory cell, comprising:
- causing first and second voltage generating circuits to respectively generate first and second voltages;
- causing a program circuit to convert the second voltage to a third voltage lower than the second voltage with the first voltage used as a reference and apply the third voltage to a data line;
- causing a column decoder to connect the data line to the bit line by applying the first voltage to the gate of the second MOS transistor; and
- making a stress test of the memory cell by applying the third voltage to the bit line via the second MOS transistor, setting the control gate into a non-selected state and setting a potential of the source line to a potential lower than the third voltage.

* * * * *